United States Patent [19]

Ikeya

[11] Patent Number: 5,460,538
[45] Date of Patent: Oct. 24, 1995

[54] SOCKET

[75] Inventor: Kiyokazu Ikeya, Shizuoka, Japan

[73] Assignee: Texas Instruments Incorporated, Dallas, Tex.

[21] Appl. No.: 189,815

[22] Filed: Feb. 1, 1994

[30] Foreign Application Priority Data

Feb. 8, 1993 [JP] Japan .................................. 5-044540

[51] Int. Cl.$^6$ .................................................. H01R 13/62
[52] U.S. Cl. .................................................. 439/331; 439/73
[58] Field of Search .................................. 439/70, 71, 72, 439/73, 330, 331, 525, 526, 101, 108, 886

[56] References Cited

U.S. PATENT DOCUMENTS

| | | | |
|---|---|---|---|
| 4,758,176 | 7/1988 | Abe et al. | 439/331 |
| 5,100,332 | 3/1992 | Egawa | 439/331 |
| 5,169,321 | 12/1992 | Matsuoka | 439/886 |
| 5,234,349 | 8/1993 | Matsuoka et al. | 439/331 |
| 5,244,404 | 9/1993 | Kishi et al. | 439/331 |
| 5,360,348 | 11/1994 | Johnson | 439/330 |

*Primary Examiner*—Gary F. Paumer
*Assistant Examiner*—Hien D. Vu
*Attorney, Agent, or Firm*—Russell E. Baumann; Richard L. Donaldson; René E. Grossman

[57] ABSTRACT

A socket with a base 10 and a cover member 20 rotable with respect to the base 10 for use especially in a burn-in test of an electrical part 100 with a narrow pitch between leads 100a of the electrical part which has a holding cover 27 within the cover 20 which is rotable and pivotable and a plurality of thin insulating sheet members 15 positioned between a plurality of contacts 14 contained in the base 10 to insure reliable operation.

10 Claims, 9 Drawing Sheets

PRIOR ART

SOCKET

BACKGROUND OF THE INVENTION

The invention relates to a socket for use in testing integrated circuit packages (IC packages) in which an IC package is placed on a printed circuit substrate for testing.

As is well known in the prior art, IC packages are placed in a socket for mounting to a circuit substrate so that a heat resistance or burn-in test can be performed on the IC packages. The IC package is mounted on the socket and circuit substrate and then put into a heating furnace to test its suitability.

Figure 11:
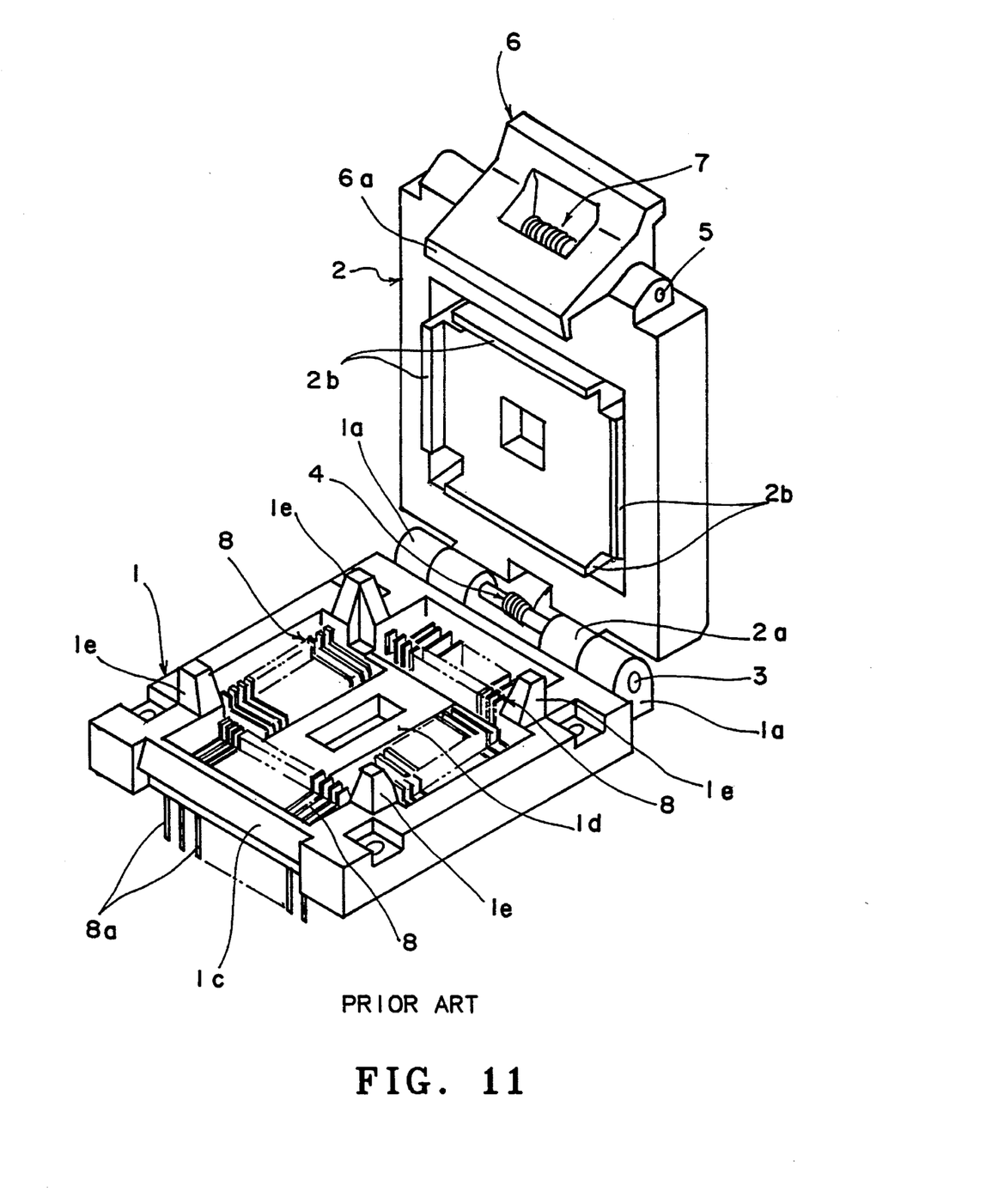
FIG. 11 is an oblique view of a socket according to the prior art.
Figure 12:
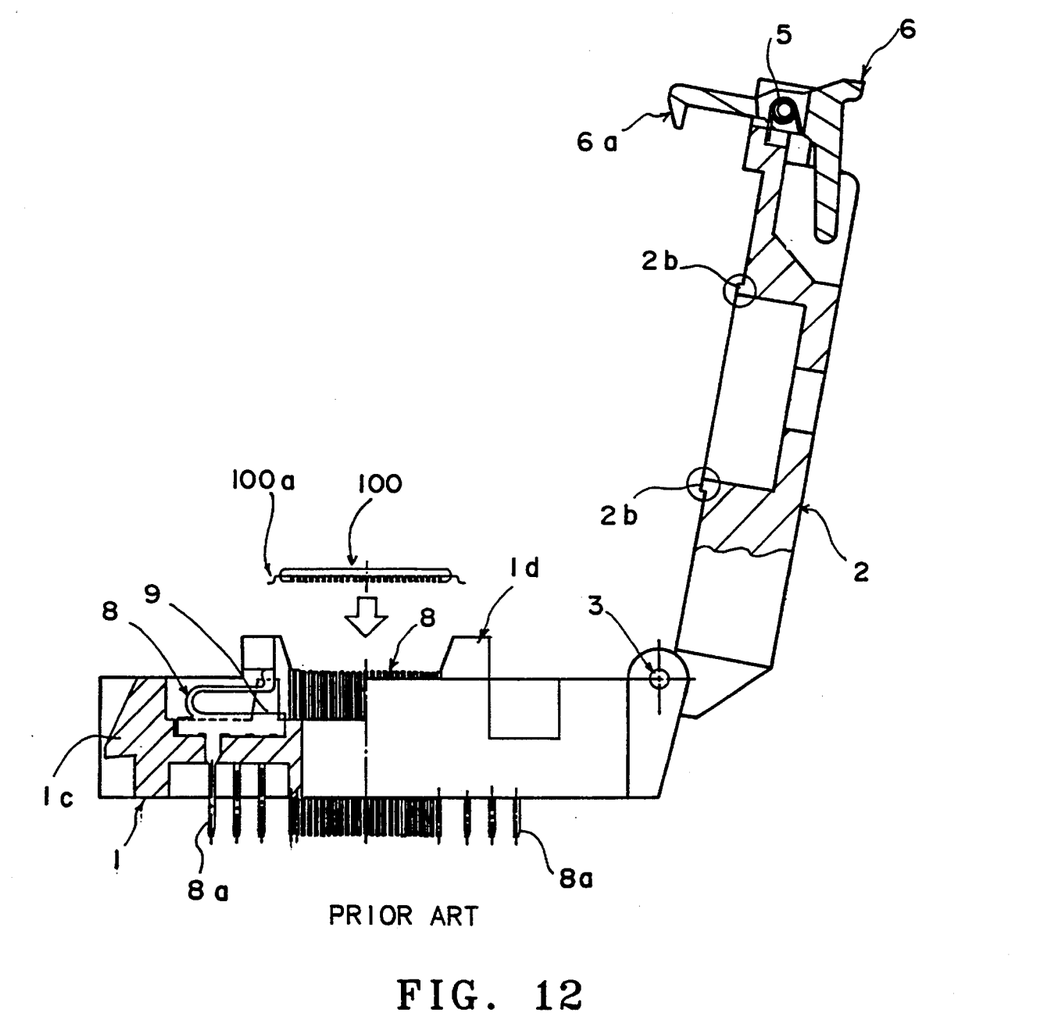
FIG. 12 is a side cross-sectional view of FIG. 11.

FIGS. 11 and 12 show prior art sockets for IC packages loading as used in such a heat-resistance test. In these sockets of FIGS. 11 and 12, a hinge part 1a is formed at one end of a base block 1 with a hinge 2a which is part of a cover 2 supported by a shaft 3. The cover 2 is rotatably supported around the shaft 3 adapted to move in the direction of opening or closing with relation to the top of the base block 1.

On the inner surface (bottom surface in the closed position) of the cover 2 along the four sides there are holding pieces 2b protruding from the cover for holding leads 100a of an IC package 100. The cover 2 is biased in the direction of being opened at all times by a spring 4 that has been provided on the shaft 3. Furthermore, a shaft 5 is provided at the opposite end of cover 2 from shaft 3 about which a latch 6 is rotatably mounted. The latch 6 has a hook 6a at its tip for engagement with the end of the base block 1 opposite the end with the hinge. A spring 7 is also provided on shaft 5 for biasing the hook 6a against the end of base block 1.

The center of the base block 1 is in the form of a rectangular frame 1d. Around this center frame 1d, a prescribed number of contacts 8 are positioned corresponding to the various leads 100a of the IC package 100 to be mounted. A lead terminal portion 8a of each contact 8 sticks out beneath the base block 1 to be connected with the circuit of the circuit substrate (not shown in the drawing) by such means as insertion or soldering.

A boss part 1e is provided for positioning the IC package on the surface of the base block. The boss parts 1e are positioned at four corner locations.

In accordance with the device of FIGS. 11 and 12, a lead 100a of the IC package 100 is placed on the corresponding contact 8 of the base block 1 and the outside of the lead 100a at the end of each side amongst those leads 100a on the four sides is positioned by the boss part 1e. Cover 2 is then rotated around the shaft 3 thereby closing the cover on base block 1 with holding piece 2b of the cover 2 contacting the leads 100a of the IC package. If the cover 2 is further pressed in the closed position, the hook 6a of the latch 6 engages with a claw part 1c of the base block 1 with a result that the cover 2 is fixed in the state of being closed on the top of the base block. In this state, the contacts 8 in the block are pressed into contact with the leads of the IC package 100 by the holding piece 2b of the cover 2. Contacts 8 are biased in the direction of the cover when in the closed position so that a desired contact pressure will be obtained.

After the completion of the burn-in test for the IC package, the engagement between the hook 6a of the latch 6 and the claw part 1c of the base block 1 is released and the cover 2 is returned to the open state due to the spring force of the spring 4. The IC package 100 is taken out of the top of the base block 1 and the heat resistance test is completed.

The prior art socket described above has a plurality of insulating wall members 9 upstanding from base block at a prescribed pitch interval. These insulating partition wall members are interposed between the contact members 8 having the same pitch interval as the contacts and insulate them one from another.

As more miniaturization is desired and the need for IC packages with more leads has increased, the distance between leads of an IC package has continued to decrease. This fact results in an extremely narrow pitch between leads and the need for partition/insulating walls to be extremely thin. The manufacture of these partition walls becomes extremely difficult, if not impossible, especially when they are to be formed integrally with the molding of the base block by a typical resin molding process.

For example, if the pitch of contacts 8 are set at 0.3 mm, correspondence to the pitch of the leads of the IC package and the width of the contact is set at 0.18 mm. with a clearance for the contact set at 0.02 mm., the resulting thickness of the insulating wall will necessarily become 0.1 mm, with a consequence that it will be very difficult to obtain both the size and strength that are necessary for maintaining reliable insulation.

In view of the fact, a socket design has been used in which the insulating wall protects the contacts on a partial basis as is shown in FIG. 12. The design, however, can suffer from short-circuiting phenomena and "cross-talks" between the neighboring contacts especially in the case where the IC leads are at narrow pitch. Additionally, the conventional construction, as described earlier, tends to make it easy for the noise to get into the electric signal that flows to the contacts because of its very structure.

Also, the prior art socket has the holding piece for the IC package integrally formed on the inner surface of the cover which engages the contact in an arc-shaped movement along with the rotary movement thereof. That is, the holding piece will move in an arc-like manner as compared with the IC lead being on a flat plane so that the rotary hinge side of the cover first contacts the leads followed by the contact of the holding piece at the rotary tip side with the lead.

Consequently, the holding of the holding pieces with the leads as a whole is staggered and uneven; and there are time differentials in said holding of the leads. This fact also provides an unsatisfactory possibility of a contact between IC leads and socket contacts.

Still further, the cover in the prior art socket tends to open suddenly when the latch is released after the completion of the IC package test which results in the tendency of the IC package to quickly "jump out" (move upward) in some cases. This can cause damage to the IC package.

SUMMARY OF THE INVENTION

Accordingly, it is an object of this invention in providing a socket for IC package testing which is capable of maintaining insulation between the leads of the package. This insulation is done without using the conventional insulating wall and allows for the width of the contacts to have narrow pitch.

Another object of this invention provides for the use of an insulating sheet to guarantee the electric insulation between the contacts.

Yet another object of this invention is to provide a socket which provides for accurate contacting between the leads and the socket contact all at one time in a perpendicular manner.

Still another object of this invention is to minimize the effects of external electric noise.

Yet still another object of this invention is to minimize part "jump out" upon opening of the socket.

Briefly described, a socket of this invention for receiving an electrical part with a plurality of leads comprises a base member, contact means including a plurality of contacts mounted in said member and adapted to make contact with said plurality of terminal leads of said electrical part, an upper cover member rotatably mounted with said base member to move between an open position and closed position with said base member, a loading part on said base member for receiving said electrical part, an electrically insulating sheet means positioned between said plurality of contacts in said base member and a holding cover member for engaging said terminal leads and bringing them in contact with said contact means when said socket is in said closed position, said holding cover member being coaxial with said upper cover member, and having means to be rotatably movable with said upper cover member as said upper cover member moves from said open position to said closed position and also having means to be pivotably movable with respect to said upper cover member so as to provide essentially uniform, simultaneous contacting between said holding cover member and all of said terminal leads during the rotatable movement from the open position to the closed position.

Further, a socket of this invention for receiving an electrical part with a plurality of terminal leads comprises an electrical part with a plurality of terminal leads comprising a base member, contact means including a plurality of contacts mounted in a said base member and adapted to make contact with said plurality of terminal leads of said electrical part, an upper cover member rotatably mounted with said base member to move between an open position and closed position with said base member, a loading part on said base member for receiving said electrical part, a plurality of electrically insulating thin sheet members positioned between said plurality of contacts in said base member of sufficient size for electrically separating one contact from another contact and positioning means for positioning said plurality of insulating sheet members including a plurality of notches provided in said base member.

In another aspect of the present invention, the socket provides a means in the socket for receiving and precisely positioning the insulating means of the socket.

In still another aspect of the present invention, there is a cushion means to absorb the force occurring during movement of the socket from an closed position to an open position.

In still another aspect of the present invention, there is a grounding means in the socket to minimize external electric noise.

In yet another aspect of this invention, there is a positioning hole in the socket member for use with automatic loading of the electronic part.

BRIEF DESCRIPTION OF THE DRAWINGS

Other objects, advantages and details of the socket of this invention appear in the following detailed description of preferred embodiments of the invention; the detailed description referring to the drawings in which:

FIG. 5b is a side view of the IC package of FIG. 5a;

DETAILED DESCRIPTION OF THE PREFERRED EMBODIMENTS

This invention will be described below by making reference to the attached drawings.

As shown in FIGS. 1–4, the loading part for an IC package 100 is set up at the center of a base block 10 that has been resin-molded. At this loading part, a support tube 11 is formed integrally with the base block 10. The support tube 11 is formed with its cross section approximately in the shape of a rectangle and a lift member 12 whose cross section is rectangular is externally inserted to its outside.

A receiving stand 121 on which the main body of the IC package 100 is placed is formed at the top of the lift member 12. A rib-shaped protuberant 122 is formed erect, facing upward, along the outer periphery of the upper surface of this receiving stand 121 so as to positionally regulate the main body of the IC package that has been placed on the receiving stand 121.

A hook 123 is protuberantly set up in such a way as to face inward (toward the centerline for mounting area of the IC) at the bottom of the lift member 12. The hook 123 is positioned to engage a step portion 111 formed on the inner periphery of the support tube 11 at the time when the lift member 12 moves upward, thereby controlling the upward movement of the lift member 12. In addition, the lower end of the receiving stand 121 engages the upper edge of the support tube 11 at the time when the lift member 12 has moved down, with the downward movement being controlled thereby.

A spring 13 is provided between the inner bottom of the receiving stand 121 and the top of the step part 111 of the support tube 11. The lift member 12 is biased at all times by spring 13 in the direction of lifting the IC package carried on the receiving stand 121 toward the top open portion.

On the perimeters of the IC package loading part of the base block 10, a prescribed number of contacts 14 are mounted in base block on each side. The lead of each contact 14 goes through the bottom of the base block 10 and extends therefrom. Each lead terminal is inserted into and soldered in the circuit substrate (not shown) to be connected to the circuit on the substrate.

Figure 5A:
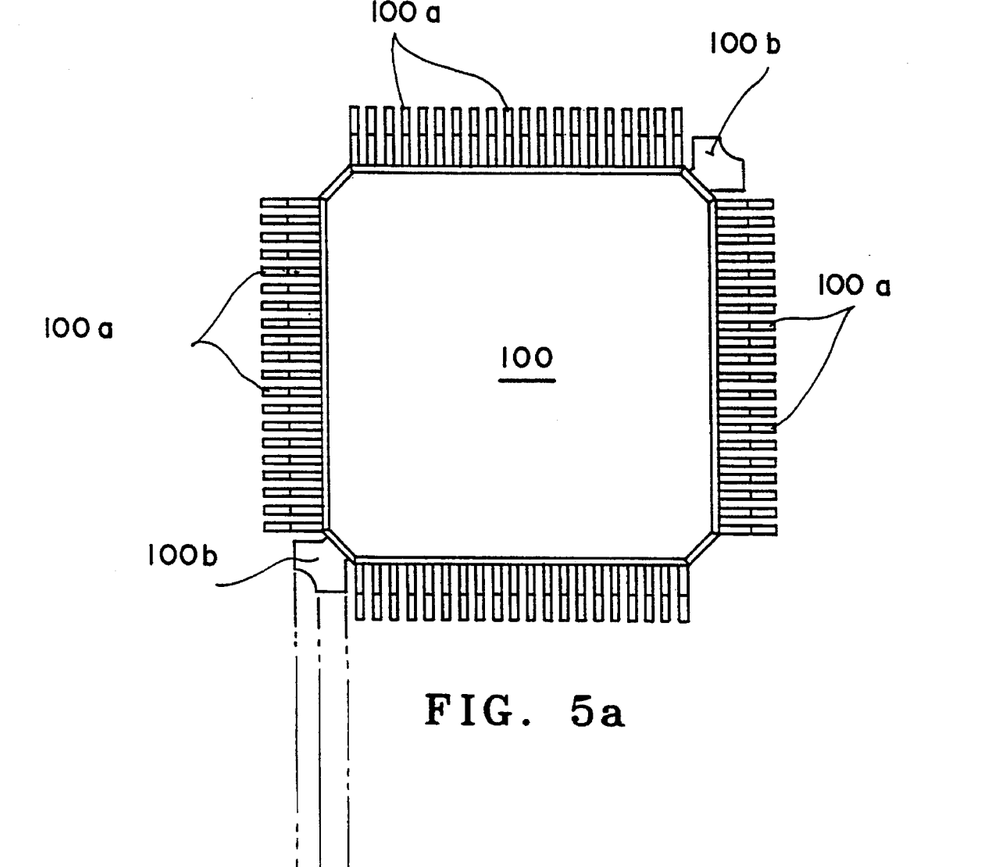
FIG. 5a is a plane view of the IC package for testing in the socket of this invention.
Figure 5B:
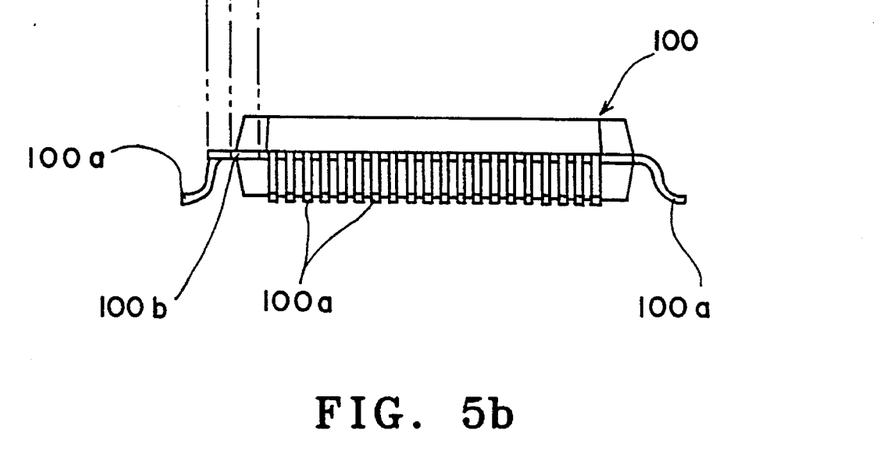

The IC package 100 that is carried on this socket is, for example, of the QFP type as is shown in FIGS. 5a and FIG. 5b with a plurality of leads 100a extending on all four sides around the perimeter of the main body. The leads 100a are made into a prescribed form during the forming stage. Positioning pieces 100b are provided and positioned at two opposite diagonal locations on the main body where two sides meet. The positioning pieces 100b play the role of positioning the leads 100a with the corresponding contacts 14 at the time when the IC package 100 is mounted on the socket. These positioning leads 100b are simultaneously produced at the time when the IC leads are prepared and are resin-sealed simultaneously with the IC leads 100a thereby providing the desired accuracy of dimension and position with the IC leads 100a.

Figure 6:
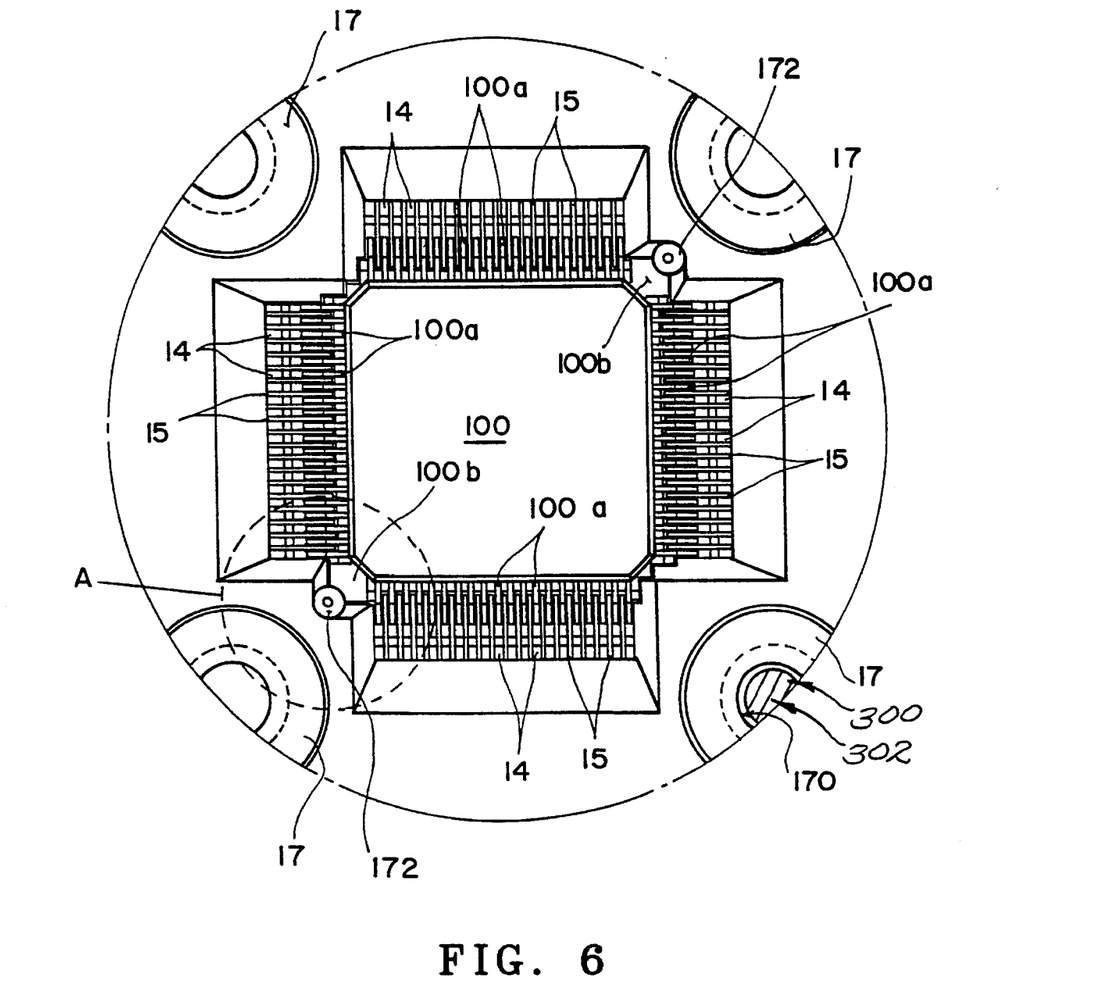
FIG. 6 is an expanded partial plane view of the IC loading part of the socket of FIG. 1.
Figure 7:
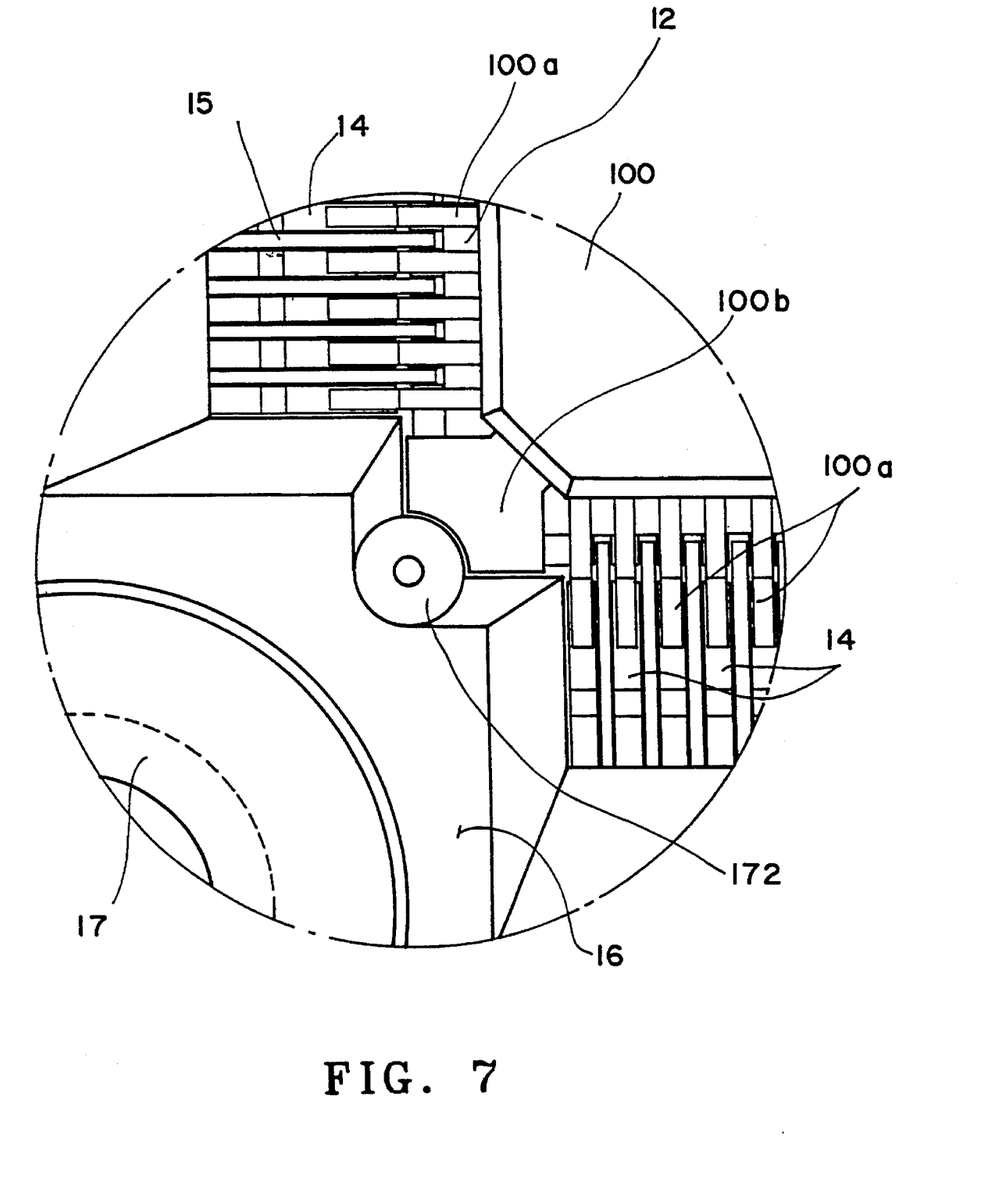
FIG. 7 is an expanded partial plane view part A of FIG. 6.

Positioning metal pins 172 corresponding to the positioning pieces 100b of the IC package 100 are provided on the main body as shown in FIGS. 6 and 7 at two diagonal locations adjacent to the loading location of the socket for the IC package testing.

FIG. 6 shows an enlargement of the IC package loading part of this socket, and FIG. 7 shows the detailed structure of part A in FIG. 6 in further expanded manner. As is shown in FIGS. 6 and 7, when the IC package 100 is placed on an automatic loading head (diagrammatically shown as arrow 300), a pin (protuberant) 302 of the automatic loading head 300 is aligned to be inserted into a positioning hole 170 of a rivet 17 that is fixed in a cap member 16.

Accordingly, the positioning pieces 100b of the IC package 100 correspond to and are engaged by the metal pins 172 on the side of the socket. Thus, by the engagement of the pin of the loading head and the rivet 17 and the engagement of the positioning pieces 100b and the metal pins 172, the IC package 100 is accurately positioned on the loading part, with each lead 100a accurately positioned with its corresponding contact 14.

Figure 8:
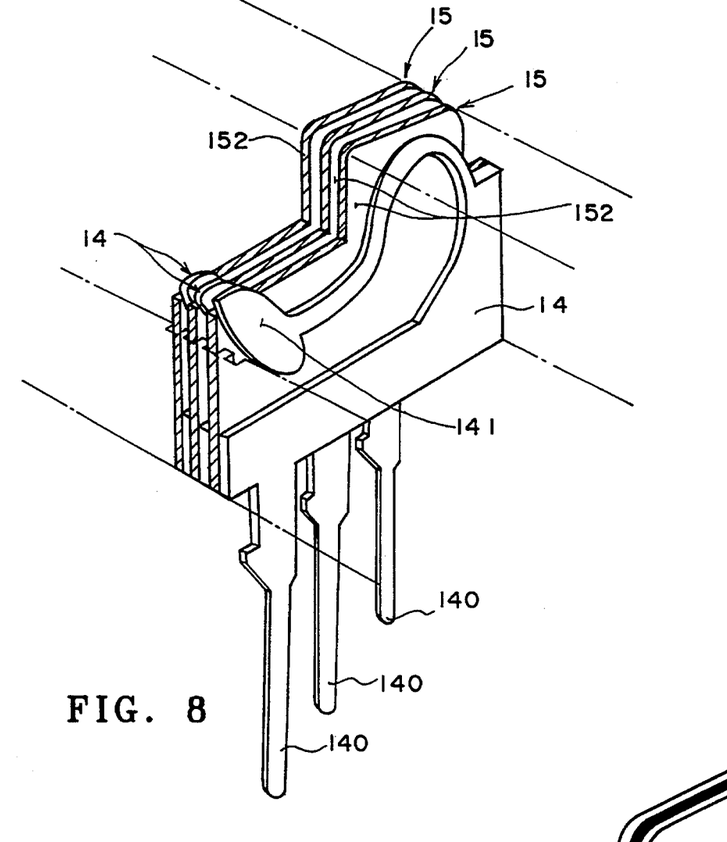
FIG. 8 is an oblique view of an insulating sheet to be used in the socket according to FIG. 1.

An electric insulating sheet 15 made, for example, of resin material is provided between the contacts 14 as is shown in detail in FIG. 8. The insulating sheet is formed by a thin film typically with a thickness of about 0.1 mm.

The insulating Sheet 15 is formed to have such a size and shape as will be sufficient to cover and shelter the main body of the contacts 14 as a whole. The front edge of each insulating sheet (that side edge adjacent a contact part 141 of the contact 14) is inserted into a groove of a concave and convex part or notch 124 formed on the outer perimeter of the lift member 12. Because of the insertion into the said part 124, each insulating sheet 15 is accurately positioned and arranged at a prescribed position between the contacts 14.

A stand-up piece 152 is protuberantly provided at the upper edge of each insulating sheet 15. The stand-up piece 152 is inserted into a groove of a concave and convex part or notch 160 formed in the bottom part of a cap member 16 which will be described later. Because of this insertion, each insulating sheet is accurately positioned and arranged at a prescribed location between the contacts 14.

The base block 10 is crowned with a cap member 16 on its upper surface adjacent contact member 14. The outer periphery of the bottom of the cap member 16 is inserted into a step part of the base block 10. The aforementioned concave and convex part or notches 160 are formed at a prescribed pitch along the perimeter inside the outer periphery of the lower part of the cap member 16. The stand-up piece 152 of the insulating sheet 15 is inserted into each groove.

The cap member 16 covers approximately the entirety of the contacts 14 and the insulating sheets 15 except for the actual contacting part 141 of the contact 14. The cap member 16 is fixed to the base block 10 by means of rivets 17. At least one of these rivets 17 has a positioning hole 170 for the IC package automatic loading head formed in such a manner that it is not a through hole (see FIG. 6).

The IC automatic loading head 300 that holds the IC package 100 is automatically and accurately positioned at the loading position of the IC package 100 by inserting the protuberant pin part 302 that has been formed at a part thereof into the positioning hole 170 of the rivet 17 in connection with the automatic loading of the IC package on this socket.

In the manner described above, the automatic loading of the IC package by using an automatic loader can be easily realized. Moreover, the relationship between the positioning hole 170 that is provided on the rivet and the pin part that is provided on the IC automatic loading head can be reversed. In other words, a protuberant part may be provided on the rivet 17 and a positioning hole may be provided on the automatic loading head.

By engagement between the positioning pieces 100b and the metal pins 172 and the engagement between the pin part of the loading head and the positioning hole, the IC package 100 is accurately positioned and placed on the loading part.

Installing screw holes 101 are through-formed at four corners of the base block 10 for securing with screws or the like the base block to the circuit substrate so that a socket for the test can be fixed to the circuit substrate through this base block.

An upper cover 20 is supported rotatably in the direction of opening and closing with the upper surface of the base block 10. At the free end of the upper cover 20 opposite the fixed end with hinges is another set of hinges for rotatably controlling a latch member 24 supported on a shaft 23.

Hinges 102 are formed at the one fixed end of the base block 10 with a shaft 18 fitted to the hinges 102. Additionally, on this shaft 18 hinges 201 have been provided at the base of the upper cover 20 to allow for the rotation with the base block.

Figure 1:
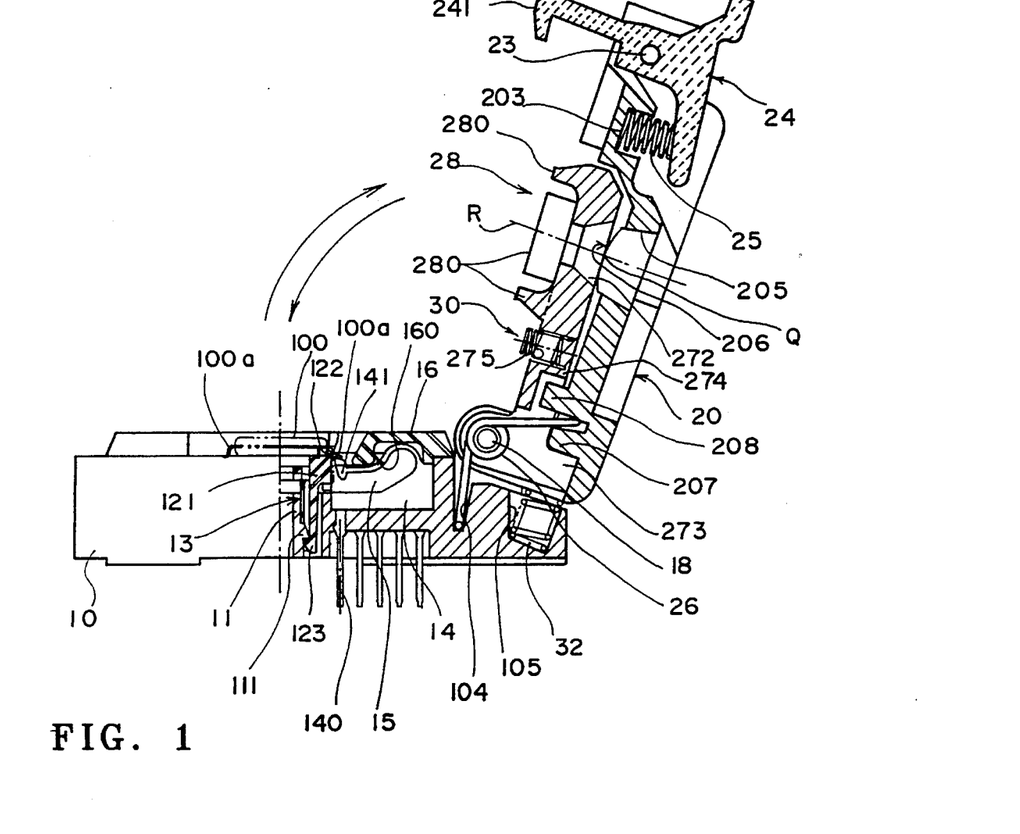
FIG. 1 is a side cross-section of a socket of the present invention in the open state.
Figure 2:
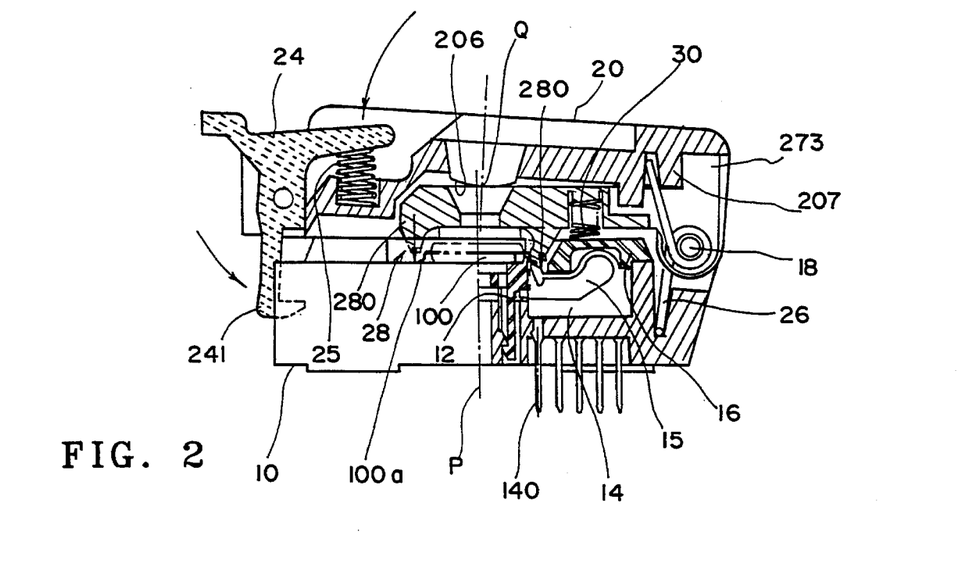
FIG. 2 is a side cross-section of the socket of FIG. 1 in the mostly closed state.

The cross section of the latch 24 at the opposite free or tip end is approximately T-shaped as is shown in FIGS. 1 and 2, with a hook 241 being formed at the tip of the T-shape. The hook 241 corresponds to a step part 103 that has been formed at one end of the base block 10. The hook is engaged with the step part 103 at the time when the upper cover 20 is closed on the upper surface of the base block 10. Due to this latching, the upper cover 20 is fixed in relationship to the upper surface of the base block.

One end of the T-shaped base of the latch 24 extends into the space over the free end of the upper cover 20 so that a spring 25 is contained between this one end of the latch and the upper surface of the free end of the cover 20.

One end of the spring 25 is inserted into a concave portion 203 that has been formed on the upper surface of the free end of the upper cover 20. The other end is engaged with the one end of the latch 24. The latch 24 is biased by the spring at all times to provide for the hook 241 engaging with the step part 103 of the base block 10.

The upper cover 20 is biased at all times in the direction of being out of contact with the upper surface of the base block 10 (open position) due to the spring pressure of a spring 26 that has been provided on the shaft 18. The spring 26 is preferably of the coil type with one end thereof being inserted into a groove 104 that has been formed at the end of the base block 10 and the other end inserted into a groove 204 formed on the inner surface of the base or fixed end of the upper cover 20. The perimeter of the socket has a center line P at the time when the upper cover 20 has been closed. The central axis line P divides in half the receiving stand 121 of the lift member 12 and support tube.

In the cover the inner surface of the rectangular part of a through hole 205 is formed in the shape of a convex surface 206 which protrudes (toward the base block 10 when in the closed position ( see FIGS. 1–4 )).

Figure 3:
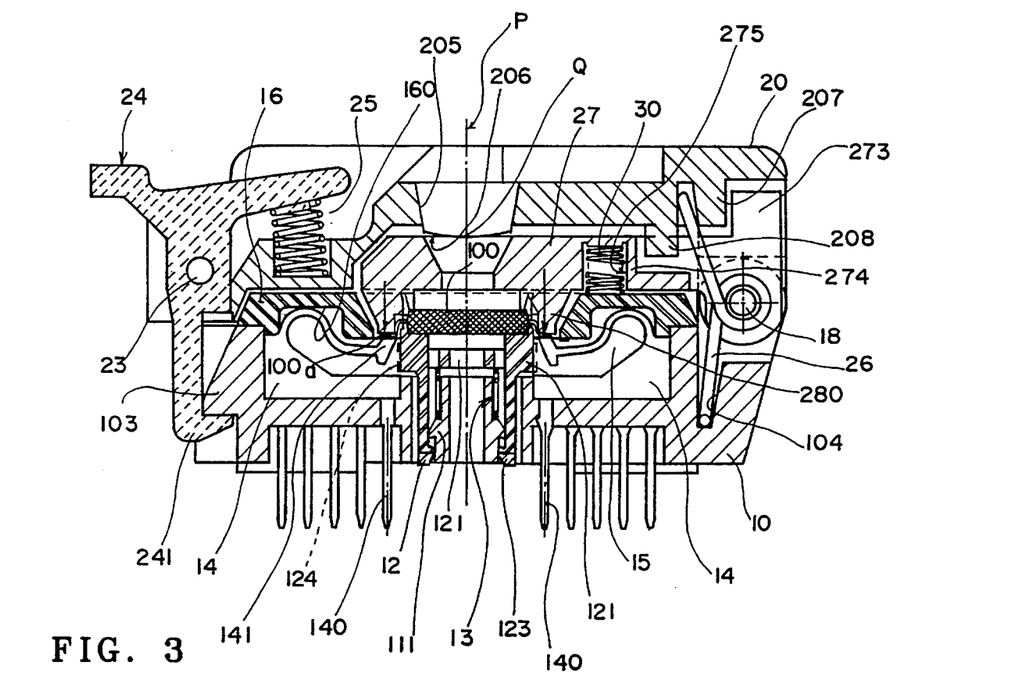
FIG. 3 is a side cross-section of the socket of FIG. 1 in the completely, closed state.

The axial line Q at the top of the convex surface 206 is situated on axial line P at the time when the upper cover 20 is in the totally closed position on the upper surface of the base block (see FIG. 3). In addition, the cover has a step part 207 approximately in the shape of L. A protuberant part 208 (extending toward the base) is formed on the inner surface from this step part 207. The step part 207 and protuberant part 208 plus a protuberant part 273 and a step part 274 which will be described later constitute an engagement means for opening a holding cover 27 and the upper cover 20 integrally.

On shaft 18 on the side of one end of the base block 10, hinges 271 are formed at the base of holding cover 27 to provide that the holding cover 27 may freely rotate in the aforesaid opening and closing direction to the base block around the shaft. Since the hinges 271 are freely mounted on the shaft, the holding cover 27 becomes freely movable within the range of its clearance.

A holding part 28 for the leads 100a of IC package is formed on the inner face of the tip of the holding cover 27. The holding cover 28 consists of four rib-shaped protrusions 280 which are adapted to press each lead group 100a that sticks out of the main body of IC package 100 around the perimeter on the four sides. That is, four rib-shaped protrusions 280 protrude from the inner surface of the holding cover 27 in such a manner that they will be approximately parallel with the four sides of the main body of the IC package 100 that has been placed on the receiving stand 121 of the lift member 12. When the upper cover 20 and the holding cover 27 are closed on the upper surface of the base block, the tip of the rib-shaped protrusions contact each contact part 141 of the contacts 14 pressing them down by the pressing force of closing the cover.

The central axial line R of holding part 28 of the holding cover 27 coincides with the central axial lines P and Q when holding cover 27 is closed together with the upper cover 20 on the upper surface of the base block. At the tip of the holding cover around its central axial line R, a through hole 272 is formed. This through hole 272 and the through hole 205 that has been formed on the upper cover 20 are for the purpose of letting the heat that is generated inside the socket during testing to escape outside the IC package 100. At the time when the upper cover 20 is closed, approximately the entirety of the holding cover 27 is inserted into the hollow part of the upper cover 20 and is closed on the upper surface of the base block.

At this junction, the upper surface of holding cover 27 (the side which is opposite to the base block 10) is in linear contact at the axial line Q at the top of the convex curved surface 206 of the upper cover 20. The holding cover 27 is biased in the closing direction from the upper cover 20 at the part of the axial line Q at the top of the convex curved surface 206, thereby rotating in the closed direction around the shaft 18.

A protuberant part 273 is formed at the L-shaped bent part of the holding cover 27. The protuberant part 273 corresponds to a step part 207 that has been formed at the L-shaped bent part of the upper cover 20. In addition, a step part 274 is formed at a location closer to the tip from the protruding part 273 of the holding cover 27. The step part 274 corresponds to a protuberant part 208 that has been formed on the upper cover 20. The step part 207 and the protruding part 273 plus the protruding part 208 and the step part 274 constitute the above described engagement means for the cover and the holding cover.

An installation hole 275 is provided in the holding cover which opens to its lower surface at a location in the neighborhood of the step part 274 of the holding cover. A coil spring 30 is inserted into the bottom of the installation hole 275. Its free end extends to a prescribed height from the inner surface of the holding cover 27 in a freely extended state.

In accordance with this invention, when the holding cover 27 is closed to a prescribed position along with the closing action of the upper cover 20, the end of the coil spring 30 contacts the surface of the cap member 16 on the base block holding the part of the holding cover in place. When the upper cover 20 is closed further, the holding cover 27 is pushed up at the part that contacts the axial line Q at the top of the convex curved surface 206 of the upper cover 20 and engages approximately in a see-saw movement in a counterclockwise direction as compared with the upper cover 20 as is shown in FIG. 2, with the part that has been supported by the coil spring 30 as the fulcrum. This see-saw movement (pivoting movement) is carried out together with the closing action of the upper cover 20 and in linkage with the closing action in the range of the clearance of the free engagement of the hinges 271 with the shaft 18.

When this action occurs with the press-in against the contact part with the axial line Q at the top of convex curved surface 206, the posture of the holding cover 27 is corrected in such a way as to assume a state of being in parallel with the top surface of the IC package and the holding cover moves down straight, perpendicularly to the leads 100a of the IC package on the lift member 12. The rib-shaped protrusions 280 correspondingly of the holding part 28 of cover 27 are parallel with the sides of the IC package. Accordingly, the leads 100a are uniformly pressed essentially at the same time by the rib-shaped protuberants 280 of the holding part 28; and thus, are pressed down by a uniform pressing force.

The rotary posture correcting means of the holding cover 27 and the moving posture correcting means of the holding part 28 for the leads 100a of the IC package 100 is constituted by the linear contact structure of the holding cover 27 against the convex curved surface 206 of the inner surface of the upper cover along with the support structure due to the coil spring that is installed in the installation hole 275 for the holding cover 27 and the free engagement between the shaft 18 and the hinges 271.

In this embodiment the convex curved surface 206 was formed on the inner surface of the upper cover 20 with the upper surface of the holding cover 27 being made to contact the axial line Q at the top of this convex curved surface 206. However, it is possible to form a convex surface on the upper surface of the holding cover 27 and cause the axial line at its top to engage in a linear contact with the inner surface of the upper cover 20.

A similar effect can be achieved even if a spherical shape is formed on either cover instead of the convex curved surface and the surface of the other cover is caused to engage in a lineal contact at its top.

Accordingly, the operation of a socket of the present invention will be explained below.

When the upper cover 20 and the holding cover 27 is open as shown in FIG. 1, the main body of the IC package 100 is placed on the receiving stand 121 of the lift member 12. Thereupon, each lead 100a of the IC package 100 is positioned immediately above the contact portion 141 of contact 14.

As the upper cover 20 is rotated in the closing direction in opposition to the spring force of the spring 26, the holding cover 27 rotates integrally with the upper cover 20 in the closing direction. When the upper cover 20 is pressed in the closing direction and rotated to a prescribed position, the end of the coil spring 30 of the holding cover 27 contacts the upper surface of the cap member 16. Then due to the spring force of the coil spring 30 against the upper cover 20, the part of the holding cover 27 that is supported by the spring 30 is maintained at a generally fixed location.

If the upper cover 20 is further pressed in the closing direction, the tip (the end opposite the fixed end) of the holding cover 27 which is in lineal contact with the axial line Q at the top of the convex curved surface 206 is pressed down as compared with the support of the spring 30 as the fulcrum.

Because of the above-described movement, the holding cover 27 has its moving posture corrected to a state of being approximately in parallel with the set top surface of the IC package 100. Because of this, positioning the posture of the rib-shaped protrusions 280 of the holding part 28 assumes a posture which is parallel with the central axial line P, straight and perpendicular to the leads 100a of the IC package 100. That is, this action moves the holding cover and rib-shaped protrusions from a further arc movement to a parallel movement with respect to central axial line P.

If the upper cover 20 is further rotated from the position shown in FIG. 2, the holding cover 27 is pressed, while maintaining the aforementioned parallel state, and each rib-shaped protrusion 280 of holding part 28 comes into contact with the leads 100a of the IC package 100 on the lift member 12. Each rib-shaped protrusion 280 of the holding part 28 contacts the leads 100a essentially simultaneously and with a uniform force, perpendicularly in an upright posture. Therefore, there will be no positional shift or shift movement of the leads 100a due to the contact with the holding part 28.

Next, the leads 100a are pressed with a uniform force by each rib-shaped protrusion 280 of the holding part 28. When a pressing force is added to the leads 100a, the lift member 12 is pressed down to a prescribed location in opposition to the spring 13. Accordingly, the leads 100a are pressed down by the rib-shaped protrusion to such an extent so that the contact part 141 of contact 14 makes contact with the corresponding lead 100a.

Figure 4:
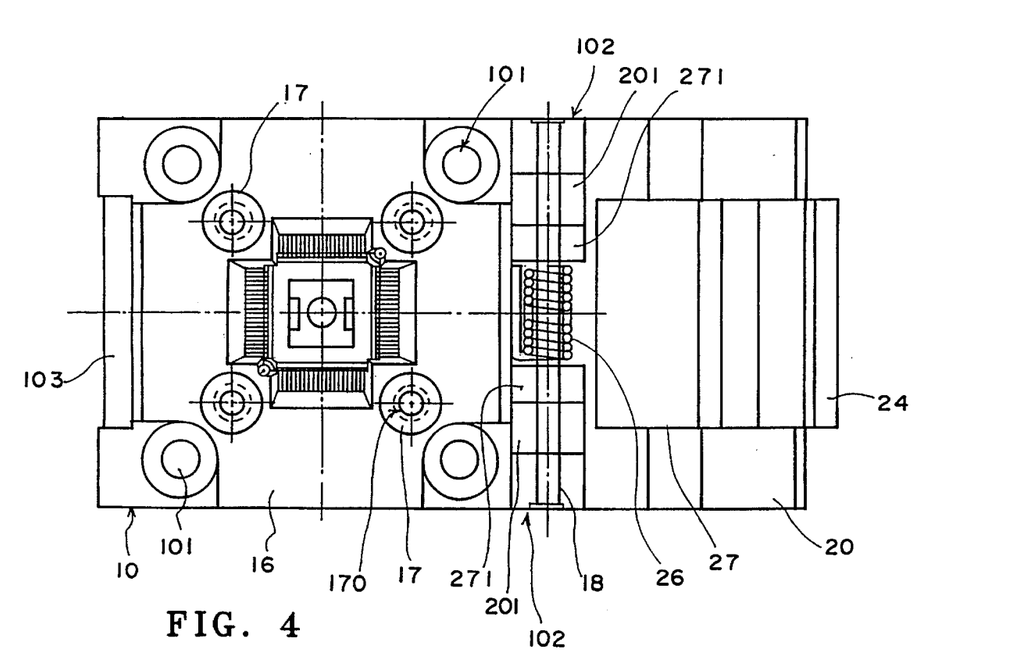
FIG. 4 is a plane view of the socket of FIG. 1 in the completely open state.

When the upper cover rotates to a prescribed position, the hook 241 of the latch 24 engages the step part of the base block 10 (as shown in FIG. 4) and the cover 20 is fixed at the top of the base block 10. In this state, the heat resistance test for the IC package is carried out to find out whether said package is satisfactory.

When the engagement of the latch 24 is released after the completion of a test, the upper cover 20 automatically start to rotate and returns in the direction of the open position by the spring pressure of the spring 26. When the upper cover 20 is opened to a prescribed position, its step part 207 comes into contact and engages with the protuberant part 273 of the aforementioned L-shaped curved part. Upon engagement between the step part 207 and the protuberant part 273, the holding cover 27 is opened integrally with the upper cover 20. That is, movement of the holding cover starts after the movement of the upper cover. Then, the upper cover 20 and the holding cover rotate and return integrally to the final position; and are completely opened from the upper surface of the base block.

In accordance with another feature of the present invention, a spring 32 is provided in a groove 105 that has been formed at one fixed end of the base block 10. When the upper cover 20 is opened to the ultimate position, its base part is received by the spring 32, with a result that the impact accompanying the rotary return movement of the upper cover is absorbed and mitigated.

Accordingly, the IC package 100 on the lift member 12 will no longer inconveniently "jump out" as part of the opening action of the upper cover 20 and the holding cover 27.

Further, the width of the insulating sheet is set at, for example, 0.1 mm. in the aforementioned example with the pitch of the leads 100a of the IC package 100 being set at 0.3 mm. and the clearance for movement of the contact part 141 of each contact 14 being set at 0.02 mm., then the width of each contact 14 will become 0.18 mm., thereby making it possible to satisfactorily secure insulation between the contact makers 14 and, at the same time providing for the width of each contact 14 to be either the same as or greater than the width of the IC leads 100a. This result allows for accurately carrying out the contact with the leads 100a in a reliable manner.

Figure 9:
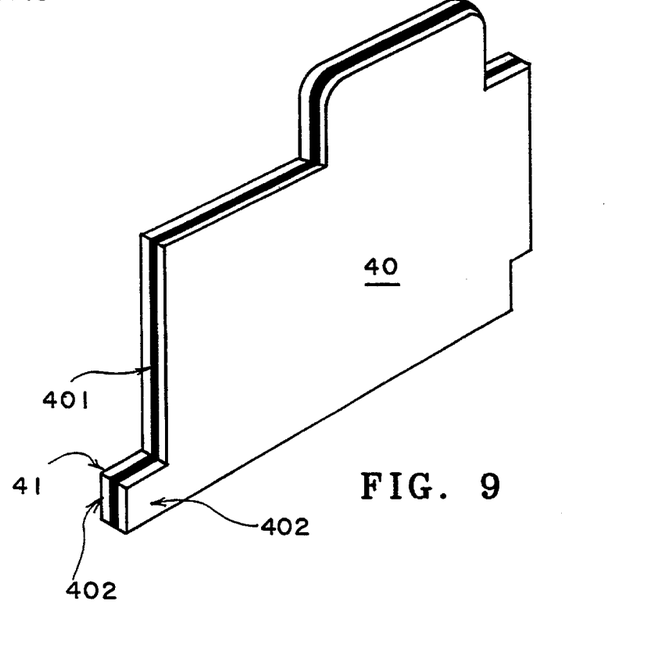
FIG. 9 is an oblique view of an example of another insulating sheet to be used in the socket of FIG. 1.

FIG. 9 shows another embodiment of an insulating sheet. This insulating sheet 40 is composed of an intermediate metal foil 401 and thin insulating films 402 made of a resin which is bonded to both of the surfaces of foil 401. The insulating sheet 40 is made of a thin film whose thickness is 0.1 mm. as in the previous case. At the base of one side of this insulating sheet 40, a protuberant part 41 is formed and this protruding part 41 is used for the purpose of grounding the metal foil 401 of the insulating sheet 40.

The insulating sheet 40 which has been constructed in the manner described above is positioned and provided between the contacts 14 as in the previous case. In the insulating sheet shown in this embodiment, satisfactory insulation can be secured as in the case of previously described insulating sheet 15. In the case of this insulating sheet 40, further, such tensile strength is increased because of its triple-layer structure with a metal foil 401 such as stainless steel being provided as an inner layer. This metal foil layer provides improved strength to the sheet as a whole.

Figure 10:
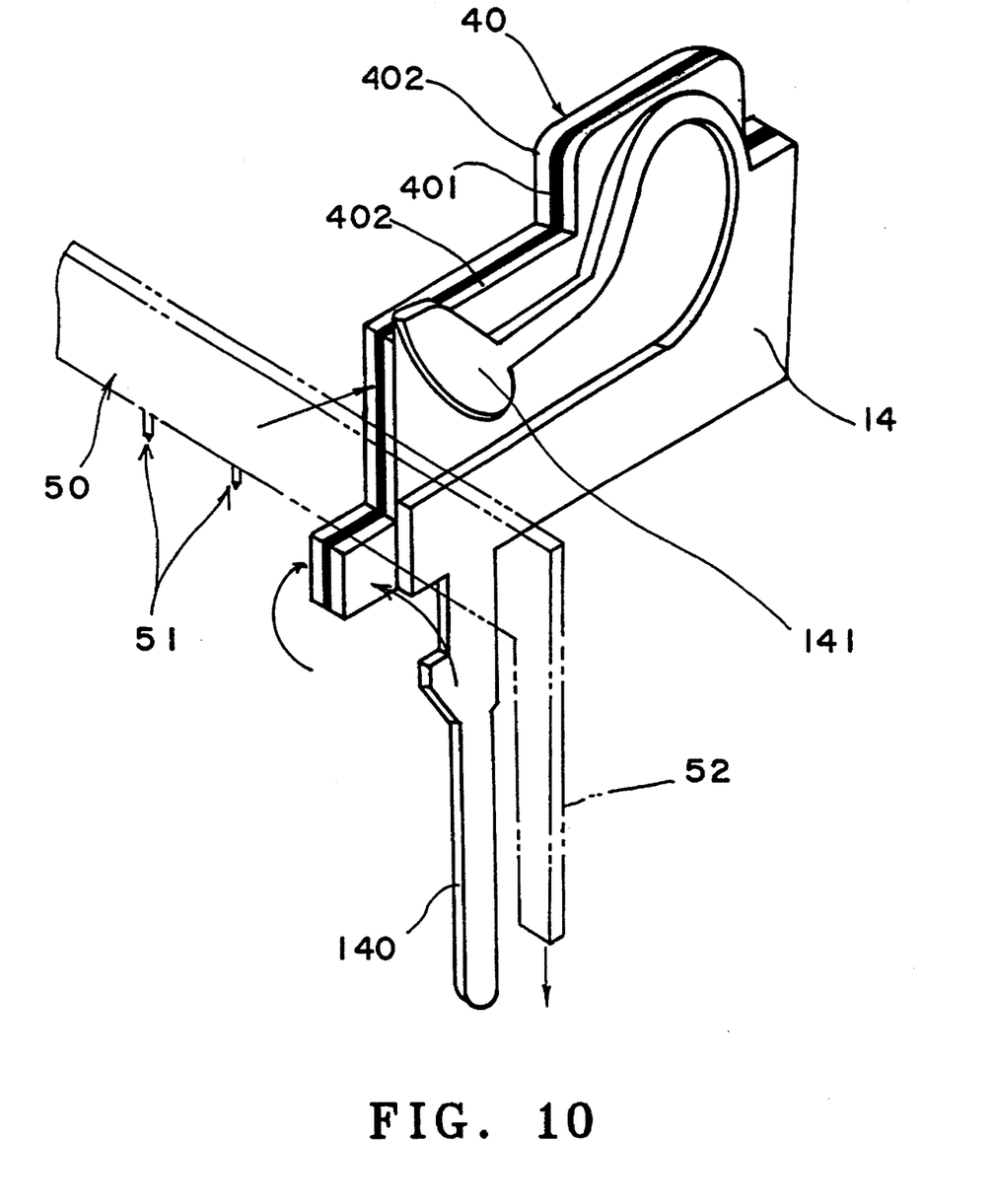
FIG. 10 is an oblique view of the grounding structure with insulating sheet of the present invention.

The insulating sheet 40 is provided between the contacts 14 as with earlier described sheet 15. Its protruding part 41 sticks out to one side. A metal plate 50 for grounding is provided for the purpose of bridging the protruding part 41 of each insulating sheet 40. A wedge-shaped protrusion 51 is provided at the part corresponding to each protruding part 41 of the metal plate 50 for grounding insulating sheet 40. This protrusion 51 is embedded into the metal foil 401 of the corresponding insulating sheet 40.

At one end of the metal plate 50, a ground terminal 52 is formed, bent approximately in the shape of an "L". This ground terminal 52 extends downward through the bottom of the base block 10 to be inserted into and soldered at the ground for the circuit substrate (which is not shown in the drawings).

According to the grounding structure in this embodiment using insulating sheet 40, an external noise that has jumped in enters the metal plate 50 for grounding through the metal foil 401 of the insulating sheet 40, thereby flowing to the ground of the circuit substrate; thus, reducing the effect of the external noise upon the electric signal that flows to the contact 14.

Accordingly, the socket of the present invention provides for the use of an insulating sheet of a thin film which is positioned between contacts in the socket to supply sufficiently high insulation even when the lead pitch of the IC package is very narrow. Also, said thin film insulating sheet allows for accurate positioning of the sheet between the contacts along with being able to make the width of the contacts at a maximum design size so as to be either equal to or larger than the width of the leads of an IC package for use in the socket, thereby improving the reliability of the contact.

Further, with this socket an even pressing force is provided simultaneously to all of the leads of the IC package; and the leads in turn make uniform simultaneous engagement with the socket contacts. This feature is especially important for a socket for use with an IC package with a narrow lead pitch to prevent positional deviation or slipping movement of the leads.

Still further, with this socket the holding cover that presses the IC leads can be opened and closed integrally with the upper cover but with a time differential in the start of its movement. Thus, the two cover members can be opened integrally by the spring force of a single return spring. As a result, a spring which is exclusively for opening the holding cover becomes unnecessary.

While the invention has been described in combination with the specific embodiments thereof, it is evident that many alternative, modifications and variations will be apparent to those skilled in the art in light of the foregoing description.

I claim:

1. A socket for receiving an electrical part with a plurality of terminal leads comprising a base member including a cap member, contact means including a plurality of contacts mounted in said base member and adapted to make contact with said plurality of terminal leads of said electrical part, said cap member overlaying said plurality of contacts in said base member, an upper cover member rotatably mounted with said base member to move between an open position and closed position with said base member, a receiving stand on said base member for receiving said electrical part, an electrically insulating means including a plurality of insulating sheets positioned between each of said plurality of contacts in said base member, said cap member and said receiving stand of said base member each having a plurality of matched notches positioned therein for receiving and precisely positioning said plurality of insulating sheets between said con, acts and a holding cover member for engaging said terminal leads and moving them in contact with said contact means when said socket is in said closed position, said holding cover member in general axial alignment with said upper cover member and being rotatably movable with said upper cover member as said upper cover member moves from said open position to said closed position and also being pivotably movable with respect to said upper cover member so as to provide essentially uniform, simultaneous contacting between said holding cover member and all of said terminal leads during the rotatable movement from the open position to the closed position.

2. A socket as set forth An claim 1 wherein said insulating means includes a plurality of multilayer sheets with each sheet having a middle layer of metal foil and two thin outer layers of insulating material.

3. A socket according to claim 2 wherein said base member includes a grounding means in electrical contact with said middle layer of metal foil of said insulating sheets.

4. A socket as set forth in claim 1 wherein said upper cover member and said holding cover member each have an opening in communication with each other and said electrical part to provide for heat dissipation from the socket.

5. The socket as set forth in claim 1 wherein said socket further includes an engagement means between the upper cover member and the holding member to provide integral movement between the two cover members during the movement from the closed position to the open position.

6. A socket as set forth in claim 1 further including a cushion means to absorb the force occurring during movement of the cover member from the closed position to the open position.

7. A socket as set forth in claim 6 wherein said cushion means is a spring member provided in said base member to engage said upper cover member.

8. A socket as set forth in claim 1 further including a positioning means in the base to provide for accurate mounting of the electric part with an automatic loading head.

9. A socket for receiving an electrical part with a plurality of terminal leads comprising a base member, contact means including a plurality of contacts mounted in a said base member and adapted to make contact with said plurality of terminal leads of said electrical part, an upper cover member rotatably mounted with said base member to move between an open position and closed position with said base member, a receiving stand on said base member for receiving said electrical part, a plurality of electrically insulating thin sheet members positioned between adjacent contacts in said base member of sufficient size for electrically separating one contact from another contact, each of said insulating thin sheet members comprising multilayer sheets with each sheet having a middle layer of metal foil and two thin outer layers of insulating material, said base member including a grounding means in electrical contact with said middle layer of metal foil of said insulating sheet and positioning means for positioning said plurality of insulating sheet members including a plurality of notches provided in said base member.

10. A socket according to claim 9 wherein said positioning means includes a cap member generally overlying said plurality of contacts in said base member and said receiving stand, said cap member and said receiving stand of said base member each having a plurality of matched notches positioned therein for receiving and precisely positioning said plurality of insulating sheets between adjacent contacts.

* * * * *